(12) United States Patent
Iyoda et al.

(10) Patent No.: US 12,213,248 B2
(45) Date of Patent: Jan. 28, 2025

(54) PRINTED WIRING BOARD

(71) Applicant: IBIDEN CO., LTD., Gifu (JP)

(72) Inventors: Shigeto Iyoda, Ogaki (JP); Tomoyuki Ikeda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 289 days.

(21) Appl. No.: 17/748,235

(22) Filed: May 19, 2022

(65) Prior Publication Data

US 2022/0377884 A1 Nov. 24, 2022

(30) Foreign Application Priority Data

May 20, 2021 (JP) ................. 2021-085033

(51) Int. Cl.
*H05K 1/02* (2006.01)
*H05K 1/11* (2006.01)
*H05K 1/03* (2006.01)

(52) U.S. Cl.
CPC ......... *H05K 1/0298* (2013.01); *H05K 1/0221* (2013.01); *H05K 1/0224* (2013.01); *H05K 1/0242* (2013.01); *H05K 1/0313* (2013.01); *H05K 1/11* (2013.01)

(58) Field of Classification Search
CPC .... H05K 1/0298; H05K 1/0313; H05K 3/108; H05K 1/2042; H05K 1/0221; H01P 3/026; H01P 3/08
See application file for complete search history.

(56) References Cited

U.S. PATENT DOCUMENTS

| 6,762,921 | B1* | 7/2004 | Asai | H05K 3/4661 |
| | | | | 361/111 |
| 9,526,169 | B2* | 12/2016 | Ha | H05K 1/0284 |
| 2011/0273240 | A1* | 11/2011 | Lin | H05K 1/0245 |
| | | | | 716/130 |
| 2012/0189859 | A1* | 7/2012 | Nozaki | H05K 1/0346 |
| | | | | 428/458 |
| 2012/0228006 | A1* | 9/2012 | Chen | H05K 1/0219 |
| | | | | 174/251 |
| 2013/0162364 | A1* | 6/2013 | Lin | H01P 3/08 |
| | | | | 333/238 |
| 2015/0107884 | A1* | 4/2015 | Inoue | H05K 1/0242 |
| | | | | 174/257 |
| 2018/0137990 | A1* | 5/2018 | Saito | H01G 4/252 |

FOREIGN PATENT DOCUMENTS

JP 2012-216685 A 11/2012

* cited by examiner

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes resin insulating layers, and conductor layers laminated on the resin insulating layers, respectively. The conductor layers includes a conductor layer including a conductor circuit formed such that the conductor circuit has recesses each having a depth of 2.0 μm or more and a bottom whose diameter is larger than a diameter of an opening part of a respective one of the recesses.

20 Claims, 6 Drawing Sheets

PRINTED WIRING BOARD

CROSS-REFERENCE TO RELATED APPLICATIONS

The present application is based upon and claims the benefit of priority to Japanese Patent Application No. 2021-085033, filed May 20, 2021, the entire contents of which are incorporated herein by reference.

BACKGROUND OF THE INVENTION

Field of the Invention

A technology disclosed herein relates to a printed wiring board.

Description of Background Art

Japanese Patent Application Laid-Open Publication No. 2012-216685 describes a multilayer substrate including: a stripline that is formed by respectively laminating conductor layers on both sides of a first dielectric layer in which a transmission line is embedded; and second dielectric layers that are respectively laminated on both sides of the stripline. The transmission line and the conductor layers are each formed of a metal foil having a ten-point average roughness (Rz) of 2 µm or less. In Japanese Patent Application Laid-Open Publication No. 2012-216685, the transmission line and the conductor layers are each formed of a metal foil having a ten-point average roughness (Rz) of 2 µm or less, and thereby, a transmission loss when a high-frequency signal is transmitted is reduced. The entire contents of this publication are incorporated herein by reference.

SUMMARY OF THE INVENTION

According to one aspect of the present invention, a printed wiring board includes resin insulating layers, and conductor layers laminated on the resin insulating layers, respectively. The conductor layers includes a conductor layer including a conductor circuit formed such that the conductor circuit has recesses each having a depth of 2.0 µm or more and a bottom whose diameter is larger than a diameter of an opening part of a respective one of the recesses.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
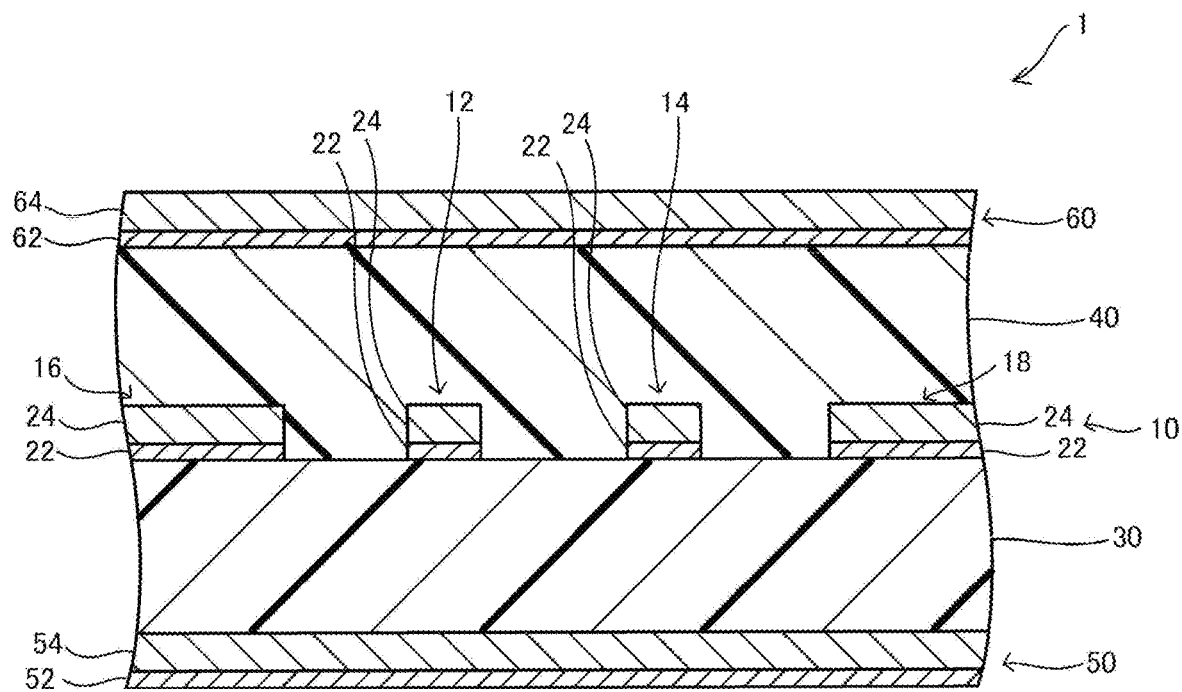
FIG. 1 is a cross-sectional view schematically illustrating a part of a printed wiring board according to an embodiment of the present invention.

Embodiments will now be described with reference to the accompanying drawings, wherein like reference numerals designate corresponding or identical elements throughout the various drawings.

EMBODIMENT

A printed wiring board 1 of an embodiment is formed by alternately laminating multiple resin insulating layers and multiple conductor layers. FIG. 1 is a cross-sectional view illustrating a part of the printed wiring board 1 of the embodiment. As illustrated in FIG. 1, the printed wiring board 1 includes a second conductor layer 50, a first resin insulating layer 30, a first conductor layer 10, a second resin insulating layer 40, and a third conductor layer 60. The second conductor layer 50, the first resin insulating layer 30, the first conductor layer 10, the second resin insulating layer 40, and the third conductor layer 60 are laminated in this order and form a stripline structure. The second conductor layer 50, the first resin insulating layer 30, the first conductor layer 10, the second resin insulating layer 40, and the third conductor layer 60 can form a part of a build-up layer formed on a core substrate. The printed wiring board 1 may have a resin insulating layer and a conductor layer other than the second conductor layer 50, the first resin insulating layer 30, the first conductor layer 10, the second resin insulating layer 40, and the third conductor layer 60.

The second conductor layer 50 is formed of copper. The second conductor layer 50 is formed of a seed layer 52 and an electrolytic plating film 54 on the seed layer 52. The second conductor layer 50 is entirely or partially a solid layer. The second conductor layer 50 is a power line or a ground line.

The first resin insulating layer 30 is formed on the second conductor layer 50. The first resin insulating layer 30 is formed using a thermosetting resin. The first resin insulating layer 30 may contain inorganic particles such as silica particles. The first resin insulating layer 30 may contain a reinforcing material such as a glass cloth. A dielectric loss tangent (Df) of the first resin insulating layer 30 is 0.02 or less.

The first conductor layer 10 is formed on the first resin insulating layer 30. The first conductor layer 10 is formed of copper. The first conductor layer 10 includes wirings (12, 14) and solid layers (16, 18). The wirings (12, 14) are signal lines. The solid layers (16, 18) are each a power line or a ground line. The wirings (12, 14) and the solid layers (16, 18) are each formed of a seed layer 22 and an electrolytic plating film 24 on the seed layer 22. When the above first resin insulating layer 30 contains a reinforcing material such as glass cloth, a copper foil may be provided between the first resin insulating layer 30 and the seed layer 22.

The second resin insulating layer 40 is formed on the first resin insulating layer 30 and the first conductor layer 10. The second resin insulating layer 40 is formed using a thermosetting resin. The second resin insulating layer 40 may contain inorganic particles such as silica particles. The second resin insulating layer 40 may contain a reinforcing material such as a glass cloth. A dielectric loss tangent (Df) of the second resin insulating layer 40 is 0.02 or less. In the printed wiring board 1 of the embodiment, the dielectric loss tangent (Df) of the first resin insulating layer 30 and the dielectric loss tangent (Df) of the second resin insulating layer 40 are both 0.02 or less. Therefore, transmission losses of the wirings (12, 14) are small.

The third conductor layer 60 is formed on the second resin insulating layer 40. The third conductor layer 60 is formed of copper. The third conductor layer 60 is formed of a seed layer 62 and an electrolytic plating film 64 on the seed layer 62. The third conductor layer 60 is entirely or partially a solid layer. The third conductor layer 60 is a power line or a ground line. When the above second resin insulating layer 40 contains a reinforcing material such as glass cloth, a copper foil may be provided between the second resin insulating layer 40 and the seed layer 62.

As described above, in the embodiment, a stripline structure is formed in which the wirings (12, 14) embedded in the first resin insulating layer 30 and the second resin insulating layer 40 are sandwiched between the second conductor layer 50 and the third conductor layer 60.

Surfaces of Wirings

Figure 2:
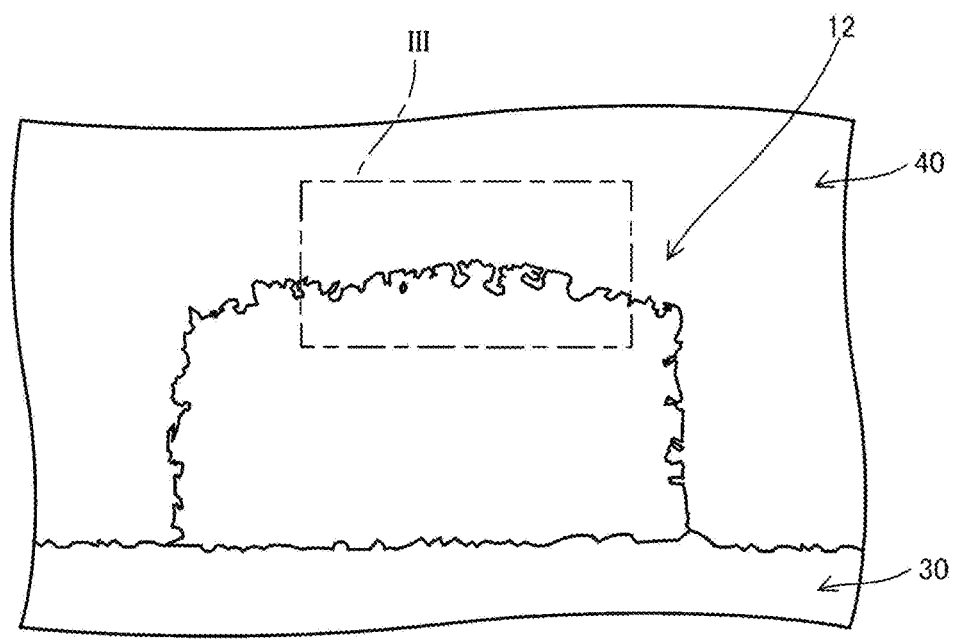
FIG. 2 is a cross-sectional view schematically illustrating a wiring according to an embodiment of the present invention.

In the following, a surface of the wiring 12 is described with reference to FIGS. 2, 3, 4A, and 4B. In FIGS. 2, 3, 4A, and 4B, the wiring 12 is described as an example. However, the same description also applies to the wiring 14. FIG. 2 is an enlarged cross-sectional view of the wiring 12. FIG. 2 is obtained by cutting the wiring 12 in a plane perpendicular to the first resin insulating layer 30. A length of an entire outer circumference of the cross section of the wiring 12 of FIG. 2 is about 50 μm. As illustrated in FIG. 2, a large number of recesses (grooves) are formed on the outer circumference of the cross section of the wiring 12. Shapes and depths of the large number of recesses are irregular.

Figure 3:
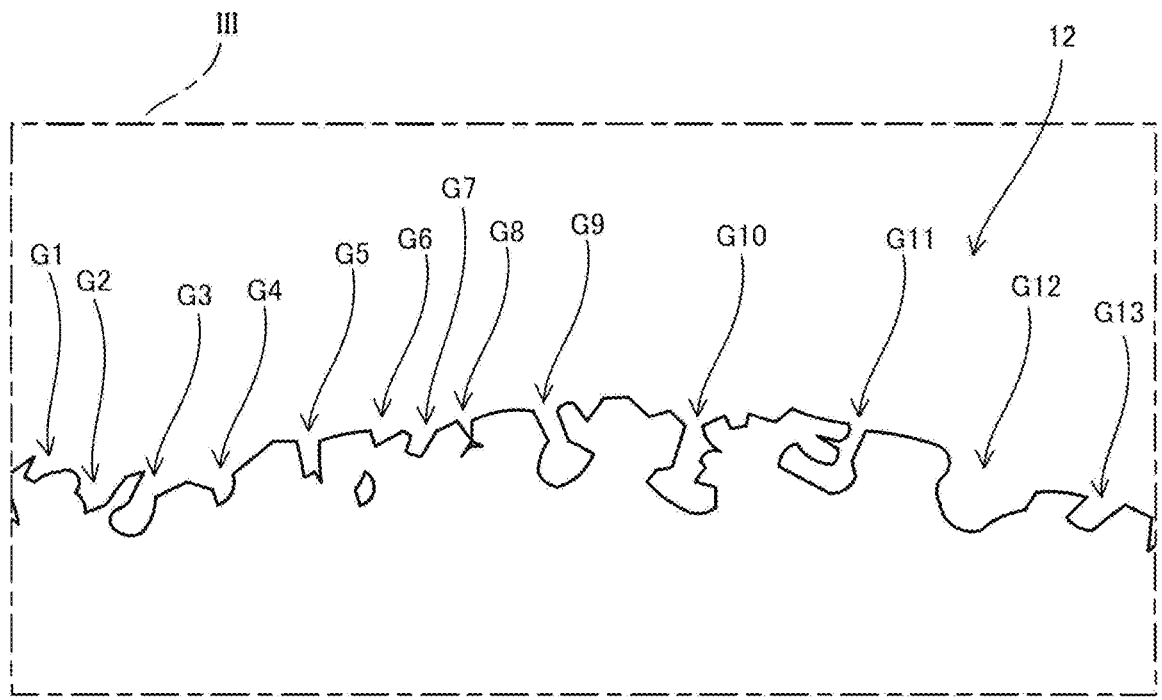
FIG. 3 is an enlarged cross-sectional view of a portion (III) of FIG. 2.

FIG. 3 is an enlarged cross-sectional view of a part of an upper side of the cross section of the wiring 12 of FIG. 2 (portion (III) of FIG. 2). A length of the outer circumference contained in the portion (III) is about 15 μm. As illustrated in FIG. 3, among multiple recesses (G1-G13) formed in the portion (III), there are three recesses (G9, G10, G11) that are relatively deep having a depth of 2.0 μm or more and of which a diameter of a bottom part is larger than a diameter of an opening part. In the embodiment, the number of recesses that are formed on the surface of the wiring 12 and are relatively deep having a depth of 2.0 μm or more and of which a diameter of a bottom part is larger than a diameter of an opening part is small. A recess that has a depth of 2.0 μm or more and of which a diameter of a bottom part is larger than a diameter of an opening part may be referred to as a "crevasse-like recess." In FIG. 3, for the recess (G3), a diameter of a bottom part is larger than a diameter of an opening part, but a depth is less than 2.0 μm, and thus, the recess (G3) is not a crevasse-like recess. For the recess (G12), a depth is 2.0 μm, but a diameter of an opening part is larger than a diameter of a bottom part, and thus, the recess (G12) is not a crevasse-like recess. The length of the entire outer circumference of the cross section of the wiring 12 in FIG. 2 is about 50 μm. However, the number of the above-described crevasse-like recesses (recesses that have a depth of 2.0 μm or more and of which a diameter of a bottom part is larger than a diameter of an opening part) is 5 or less on the entire circumference. That is, in the embodiment, the number of crevasse-like recesses is 10 or less per 100 μm length of the outer circumference of the cross section of the wiring 12 (see FIG. 2).

Figure 4A:
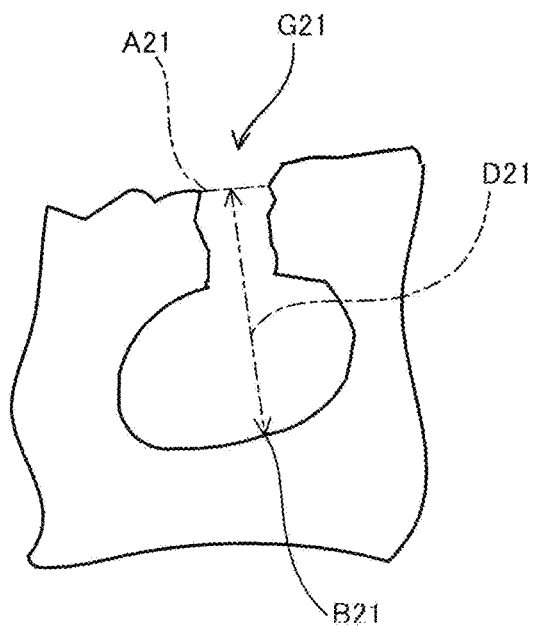
FIGS. 4A and 4B are each a cross-sectional view for describing a depth of a recess.
Figure 4B:
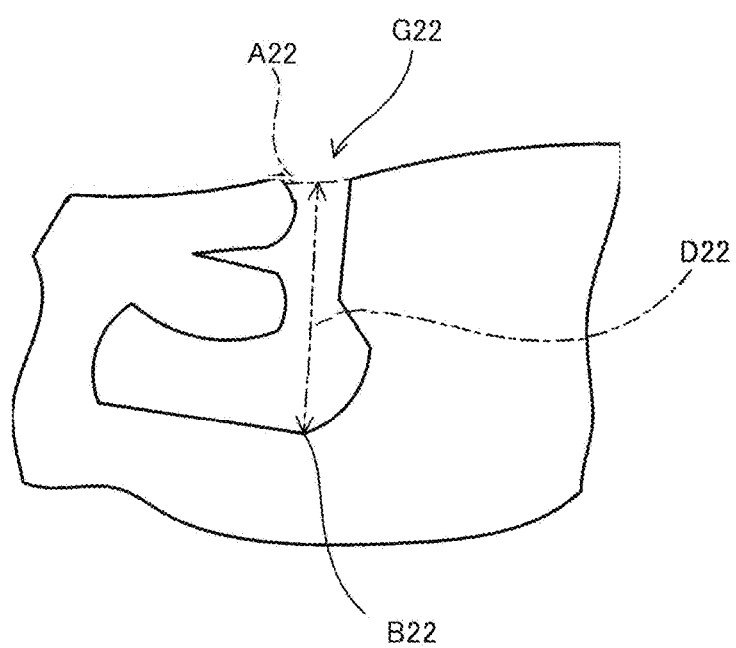

FIGS. 4A and 4B are each a cross-sectional view for describing a "depth of a recess" in the embodiment. The depths of the recesses are measured by analyzing an image of the cross section of the wiring 12. FIGS. 4A and 4B respectively illustrate two examples. The example of FIG. 4A illustrates the recess (G21). The recess (G21) has a shape in which a diameter of a bottom part (B21) is larger than a diameter of an opening part (A21). A depth (D21) of the recess (G21) is a linear distance from the opening part (A21) to the bottom part (B21). The example of FIG. 4B illustrates the recess (G22). The recess (G22) has a shape of which an inner part bends on one side. A depth (D22) of the recess (G22) is a linear distance from an opening part (A22) to a bottom part (B22). In this way, a depth of a recess is a linear distance from an opening part to a bottom part regardless of a shape of the recess. In practice, the depths of the recesses are measured by analyzing an image of the cross section of the wiring 12.

For recesses (crevasse-like recesses) that are among the recesses formed on the surface of the wiring 12 and are relatively deep having a depth of 2.0 μm or more and of which a diameter of a bottom part is larger than a diameter of an opening part, accurate roughness measurement using a common roughness measurement device is difficult and the transmission loss of the wiring 12 is highly likely to be increased. Therefore, when the number of crevasse-like recesses is large, the transmission loss of the wiring 12 increases. When the number of the crevasse-like recesses per 100 μm length of the outer circumference of the cross section of the wiring 12 is 10 or less as in the embodiment, the transmission loss of the wiring 12 is relatively small. Therefore, according to the embodiment, the printed wiring board 1 having the wirings (12, 14) with low transmission losses is provided. The wirings (12, 14) of the present embodiment are each an example of a "conductor circuit."

In a formation process of the wirings (12, 14), surfaces of the wirings (12, 14) are roughened by performing etching (for example, a CZ roughening treatment) for rough surface formation. The etching (CZ roughening treatment) for rough surface formation is a treatment performed after a quick etching treatment for seed layer removal. Hereinafter, the etching for rough surface formation may be simply referred to as "etching." By roughening the surfaces of the wirings (12, 14) by etching, adhesion to the first resin insulating layer 40 is improved. When the surfaces of the wirings (12, 14) are etched, an etching amount is, for example, 1.0 μm in a depth direction from a surface of a wiring. In another example, an etching amount may be 0.5 μm in a depth direction from a surface of a wiring. On the other hand, it is also possible that the surfaces of the wirings (12, 14) are not etched (not roughened). Here, the "etching amount" is a depth amount by which the surface of the wiring is etched in a depth direction by the etching (CZ roughening treatment) for rough surface formation described above.

In the embodiment, a root mean square height (Rq) of the surfaces of the wirings (12, 14) is 1.00 μm or less. A ten-point average roughness (Rz) of each of the surfaces of the wirings (12, 14) is 2.00 μm or less. The above numerical values (Rq, Rz) are calculated based on actual measurement values measured using a 3D microscope (for example, a shape analysis laser microscope "VK-X1000").

In the printed wiring board 1 of the embodiment, on the surface of the second conductor layer 50, the surfaces of the solid layers (16, 18), and the surface of the third conductor layer 60, the number of crevasse-like recesses per 100 μm length of an outer circumference of a cross section may be more than 10. When a large number of crevasse-like recesses are formed on the surface of the second conductor layer 50, the surfaces of the solid layers (16, 18), and the surface of the third conductor layer 60, a high anchor effect is realized. Further, the second conductor layer 50, the solid layers (16, 18), and the third conductor layer 60 are all each a power line or a ground line, and thus, the transmission loss does not cause a problem.

Method for Manufacturing Printed Wiring Board

Figure 5A:
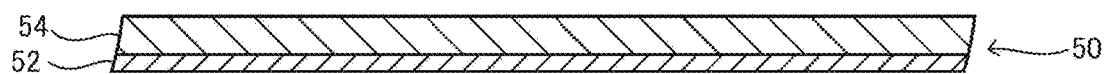
FIG. 5A is a cross-sectional view schematically illustrating a method for manufacturing a printed wiring board according to an embodiment of the present invention.
Figure 5B:
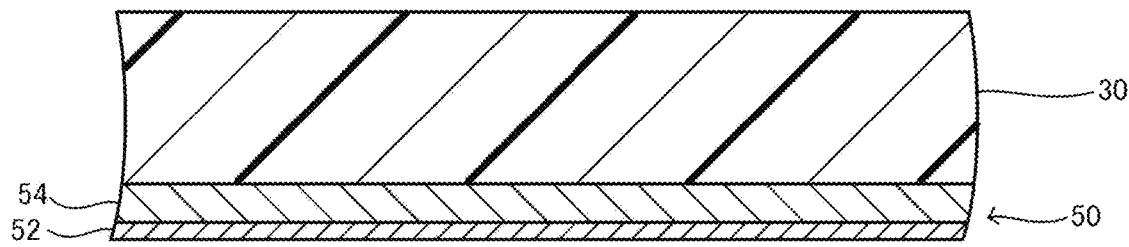
FIG. 5B is a cross-sectional view schematically illustrating a method for manufacturing a printed wiring board according to an embodiment of the present invention.
Figure 5C:
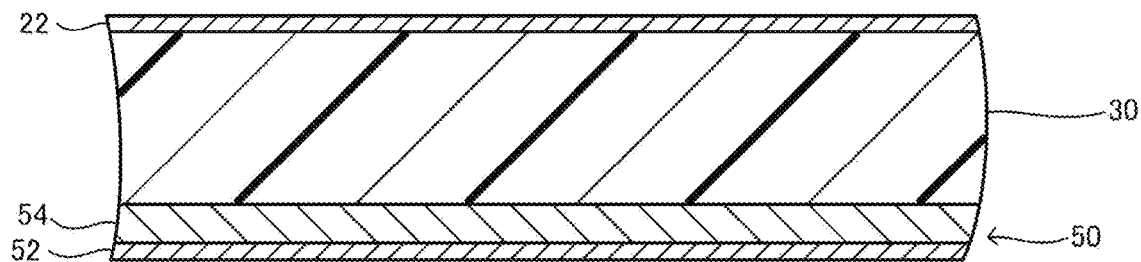
FIG. 5C is a cross-sectional view schematically illustrating a method for manufacturing a printed wiring board according to an embodiment of the present invention.
Figure 5D:
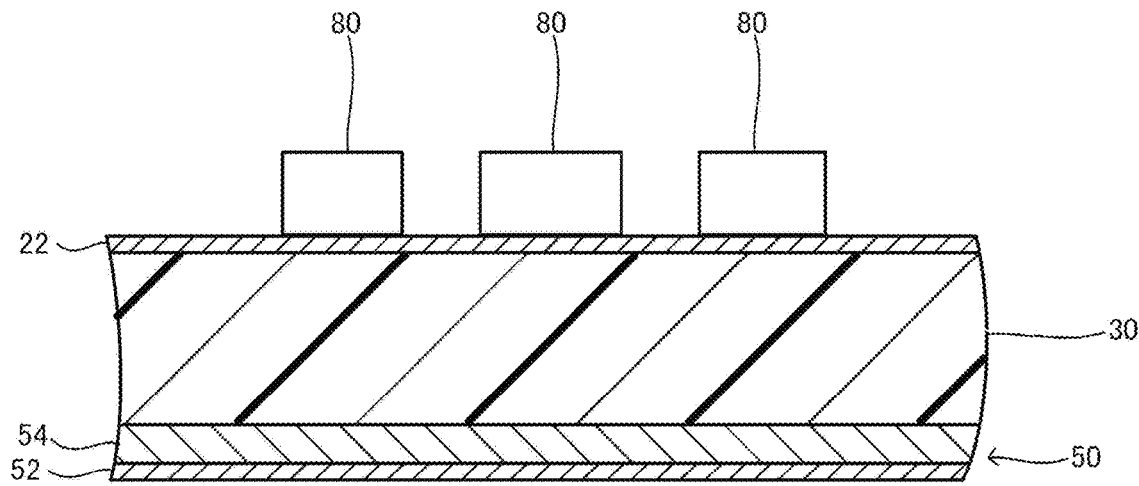
FIG. 5D is a cross-sectional view schematically illustrating a method for manufacturing a printed wiring board according to an embodiment of the present invention.

FIGS. 5A-5G illustrate a method for manufacturing the printed wiring board 1 of the embodiment. FIG. 5A illustrates the second conductor layer 50 formed of the seed layer 52 and the electrolytic plating film 54 on the seed layer 52. The upper surface of the second conductor layer 50 is roughened by etching. As illustrated in FIG. 5B, the first resin insulating layer 30 is formed on the second conductor layer 50. The upper surface of the first resin insulating layer 30 is roughened by a permanganate treatment. As illustrated in FIG. 5C, the seed layer 22 is formed on the first resin insulating layer 30. As illustrated in FIG. 5D, a plating resist 80 is formed on the seed layer 22. The plated resist 80 has openings for forming the wirings (12, 14) and the solid layers (16, 18) (FIG. 1).

Figure 5E:
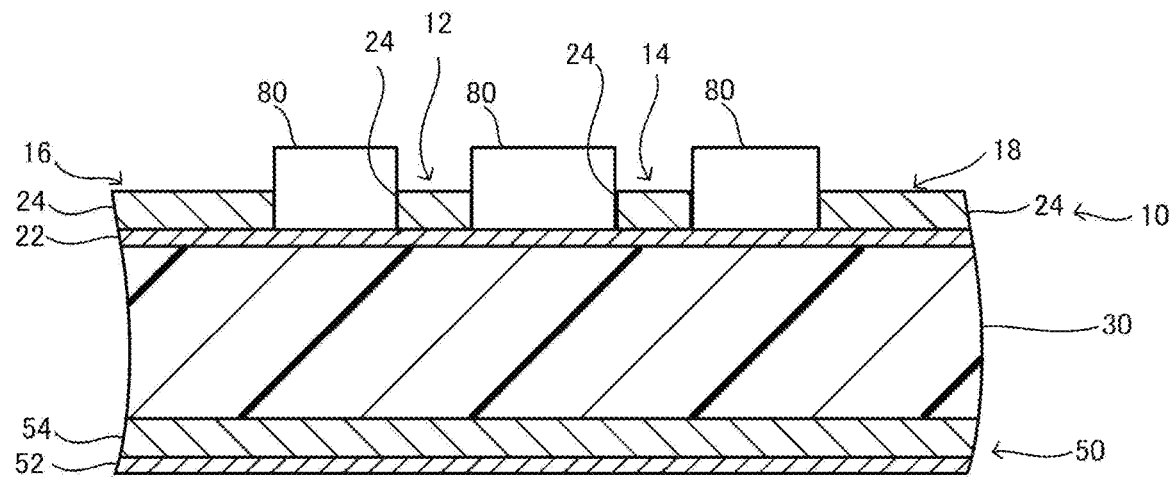
FIG. 5E is a cross-sectional view schematically illustrating a method for manufacturing a printed wiring board according to an embodiment of the present invention.

As illustrated in FIG. 5E, the electrolytic plating film 24 is formed on the seed layer 22 exposed from the plating resist 80. The electrolytic plating film 24 fills the openings. The wirings (12, 14) and the solid layers (16, 18) are formed of the seed layer 22 and the electrolytic plating film 24 formed on the seed layer 22. As a result, the first conductor layer 10 is formed.

Figure 5F:
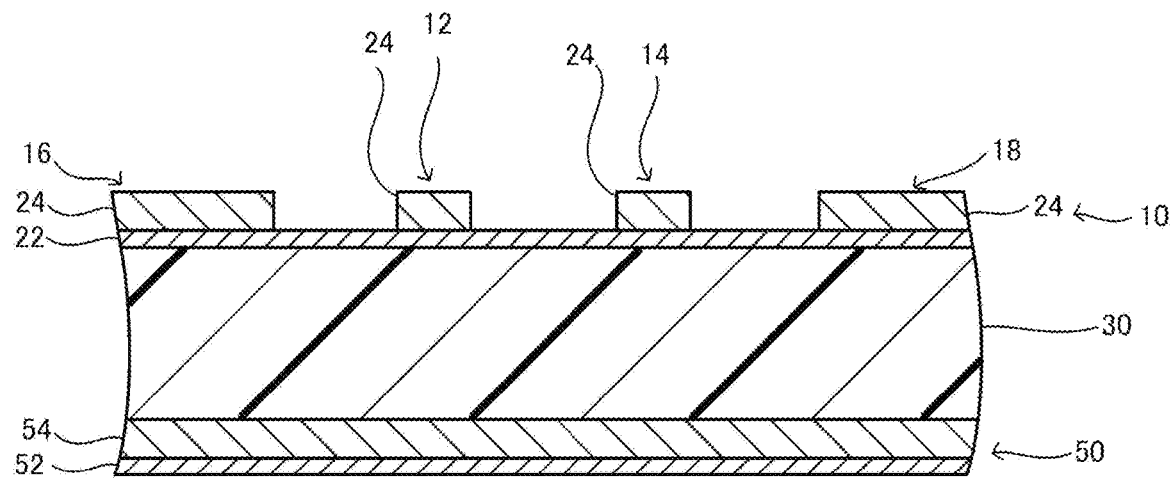
FIG. 5F is a cross-sectional view schematically illustrating a method for manufacturing a printed wiring board according to an embodiment of the present invention.
Figure 5G:
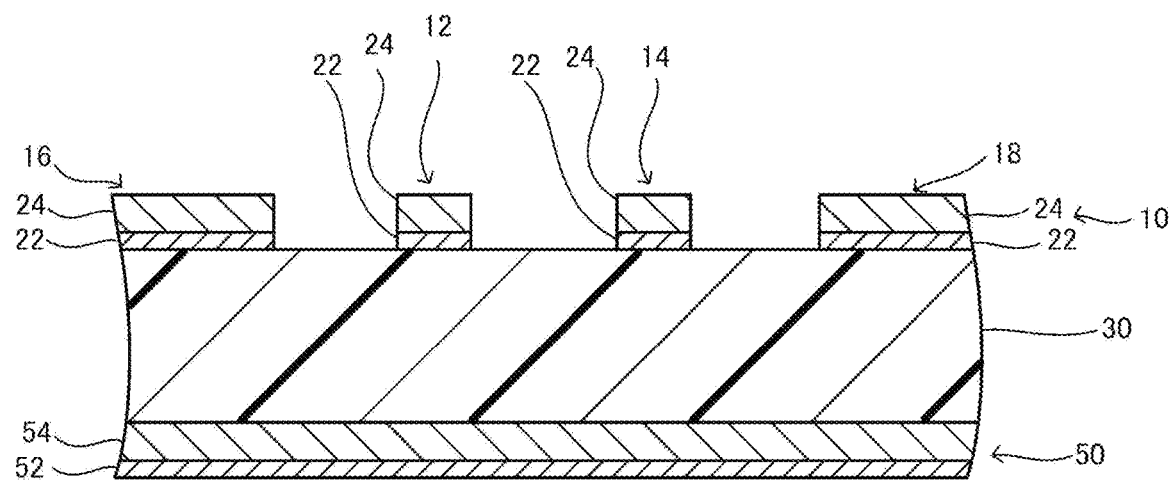
FIG. 5G is a cross-sectional view schematically illustrating a method for manufacturing a printed wiring board according to an embodiment of the present invention.

As illustrated in FIG. 5F, the plating resist 80 is removed. As illustrated in FIG. 5G, the seed layer 22 exposed from the electrolytic plating film 24 is removed by a quick etching treatment.

After that, in a state in which the wirings (12, 14) are masked, the surfaces of the solid layer (16, 18) are roughened by etching (a CZ roughening treatment). The surfaces of the wirings (12, 14) after the mask is removed are subjected to 1.0 μm etching. It is also possible that the surfaces of the wirings (12, 14) are subjected to 0.5 μm etching. It is also possible that the surfaces of the wirings (12, 14) are not subjected to etching. The surfaces of the wirings (12, 14) may be treated such that the number of recesses (crevasse-like recesses) that have a depth of 0.2 μm or more and of which a diameter of a bottom part is larger than a diameter of an opening part is 10 or less per 100 μm length of an outer circumference of a cross section of each of the wirings (12, 14).

After that, the second resin insulating layer 40 is formed on the first resin insulating layer 30 and the first conductor layer 10. The upper surface of the first resin insulating layer 30 is roughened by a permanganate treatment. The third conductor layer 60 formed of the seed layer 62 and the electrolytic plating film 64 on the seed layer 62 is formed on the second resin insulating layer 40. The stripline structure is formed. As a result, the printed wiring board 1 (FIG. 1) of the embodiment is obtained.

First Modified Embodiment

An example of a difference of a printed wiring board 1 of a first modified embodiment from that of the embodiment is described below. In the first modified embodiment, further, the number of recesses (crevasse-like recesses) that have a depth of 0.2 μm or more and of which a diameter of a bottom part is larger than a diameter of an opening part is 10 or less per 100 μm length of an outer circumference of a cross section of each of the solid layers (16, 18). That is, in the first modified embodiment, the number of crevasse-like recesses is 10 or less per 100 μm length of an outer circumference of a cross section of each of the wirings (12, 14) and the solid layers (16, 18) of the first conductor layer 10. In the first modified embodiment, the wirings (12, 14) and the solid layers (16, 18) are each an example of a "conductor circuit."

Second Modified Embodiment

In a second modified embodiment, the number of crevasse-like recesses is 10 or less per 100 μm length of an outer circumference of a cross section of at least one of the second conductor layer 50 and the third conductor layer 60. That is, in the second modified embodiment, the number of crevasse-like recesses is 10 or less per 100 μm length of an outer circumference of a cross section of each of the wirings (12, 14) of the first conductor layer 10 and at least one of the second conductor layer 50 and the third conductor layer 60. In the second modified embodiment, the wirings (12, 14) and at least one of the second conductor layer 50 and the third conductor layer 60 are each an example of a "conductor circuit."

Third Modified Embodiment

In a third modified embodiment, the number of crevasse-like recesses is 10 or less per 100 μm length of an outer circumference of a cross section of each of the wirings (12, 14) and the solid layers (16, 18) of the first conductor layer 10 and all the second conductor layer 50 and the third conductor layer 60. In the third modified embodiment, the wirings (12, 14), the solid layers (16, 18), the second conductor layer 50, and the third conductor layer 60 are each an example of a "conductor circuit."

Fourth Modified Embodiment

In a fourth modified embodiment, a printed wiring board 1 does not have a stripline structure. The printed wiring board 1 of the fourth modified embodiment includes multiple resin insulating layers and multiple conductor layers alternately laminated with the multiple resin insulating layers, and may have any structure as long as the number of crevasse-like recesses is 10 or less per 100 μm length of an outer circumference of a cross section of a conductor circuit included in the multiple conductor layers.

Fifth Modified Embodiment

In a fifth modified embodiment, the root mean square height (Rq) of the surfaces of the wirings (12, 14) are larger than 1.0 µm. The ten-point average roughness (Rz) of each of the surfaces of the wirings (12, 14) is larger than 2.00 µm.

Six Modified Embodiment

In a sixth modified embodiment, the dielectric loss tangent (Df) of each of the first resin insulating layer 30 and the second resin insulating layer 40 is larger than 0.02.

It is thought that it may be possible that a numerical value representing a surface roughness, such as a ten-point average roughness (Rz), an arithmetic mean roughness (Ra), or a root mean square height (Rq), is not proportional to an actual transmission loss of a wiring.

A printed wiring board according to an embodiment of the present invention includes: multiple resin insulating layers; and multiple conductor layers that are alternately laminated with the multiple resin insulating layers. The multiple conductor layers include a conductor circuit. The number of recesses that have a depth of 2.0 µm or more and of which a diameter of a bottom is larger than a diameter of an opening part is 10 or less per 100 µm length of an outer circumference of a cross section of the conductor circuit.

Among recesses formed on a surface of a conductor circuit, recesses that are relatively deep having a depth of 2.0 µm or more and of which a diameter of a bottom part is larger than a diameter of an opening part are highly likely to increase a transmission loss of the conductor circuit. In a printed wiring board according to an embodiment of the present invention, the number of recesses that have a depth of 2.0 µm or more and of which a diameter of a bottom part is larger than a diameter of an opening part is 10 or less per 100 µm length of an outer circumference of a cross section of a conductor circuit. Therefore, according to an embodiment of the present invention, since the number of the recesses that have a depth of 2.0 µm or more and of which a diameter of a bottom part is larger than a diameter of an opening part is relatively small, a printed wiring board having a conductor circuit with a low transmission loss is provided.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a plurality of resin insulating layers; and
a plurality of conductor layers laminated on the resin insulating layers, respectively,
wherein the plurality of conductor layers includes a first conductor layer including a conductor circuit and a second conductor layer including a second conductor circuit formed such that the second conductor circuit has recesses each having a depth of 2.0 µm or more and a bottom whose diameter is larger than a diameter of an opening part of a respective one of the recesses, and the second conductor circuit of the second conductor layer in the plurality of conductor layers includes a signal line and one of a power line and a ground line such that a number of the recesses in the signal line is 10 or less per 100 µm length in an outer circumference of a cross section of the second conductor circuit and that a number of the recesses in the one of the power line and the ground line is more than 10 per 100 µm length in the outer circumference of the cross section of the second conductor circuit.

2. The printed wiring board according to claim 1, wherein the first conductor circuit in the conductor layer is formed such that a number of the recesses in the first conductor circuit is 10 or less per 100 µm length in an outer circumference of a cross section of the first conductor circuit.

3. The printed wiring board according to claim 2, wherein the first conductor circuit of the first conductor layer is formed such that the depth of the recesses is a linear distance from the opening part to the bottom part.

4. The printed wiring board according to claim 2, wherein the first conductor layer in the plurality of conductor layers includes a signal line and one of a power line and a ground line such that the first conductor circuit includes the signal line.

5. The printed wiring board according to claim 4, wherein the first conductor circuit further includes one of the power line and the ground line.

6. The printed wiring board according to claim 4, wherein the first conductor circuit includes the signal line and does not include the power line and the ground line.

7. The printed wiring board according to claim 2, wherein the first conductor layer in the plurality of conductor layers includes a signal line such that the first conductor circuit includes the signal line.

8. The printed wiring board according to claim 7, wherein the first conductor circuit includes one of a power line and a ground line and that the first conductor circuit has recesses each having a depth of 2.0 µm or more and a bottom whose diameter is larger than a diameter of an opening part of a respective one of the recesses.

9. The printed wiring board according to claim 1, wherein the first conductor layer in the plurality of conductor layers includes a signal line and one of a power line and a ground line such that the first conductor circuit includes the signal line.

10. The printed wiring board according to claim 9, wherein the first conductor circuit further includes one of the power line and the ground line.

11. The printed wiring board according to claim 9, wherein the first conductor circuit includes the signal line and does not include the power line and the ground line.

12. The printed wiring board according to claim 1, wherein the first conductor layer in the plurality of conductor layers includes a signal line such that the first conductor circuit includes the signal line.

13. The printed wiring board according to claim 12, wherein the first conductor circuit includes one of a power line and a ground line and that the first conductor circuit has recesses each having a depth of 2.0 µm or more and a bottom whose diameter is larger than a diameter of an opening part of a respective one of the recesses.

14. The printed wiring board according to claim 13, wherein the first conductor circuit in the first conductor layer is formed such that a number of recesses in the first conductor circuit is 10 or less per 100 µm length in an outer circumference of a cross section of the first conductor circuit.

15. The printed wiring board according to claim 13, wherein the first conductor circuit includes the signal line and does not include the power line and the ground line.

16. The printed wiring board according to claim 13, wherein the plurality of conductor layers includes a third conductor layer having one of a power line and a ground line, the plurality of resin insulating layers includes a first resin insulating layer and a second resin insulating layer such that the second conductor layer, the first resin insulating layer, the first conductor layer, the second resin insulating layer, and the third conductor layer are laminated in an order of the second conductor layer, the first resin insulating layer, the first conductor layer, the second resin insulating layer, and the third conductor layer, and that the second conductor layer, the first resin insulating layer, the first conductor layer, the second resin insulating layer, and the third conductor layer form a stripline structure.

17. The printed wiring board according to claim 1, wherein the second conductor circuit of the second conductor layer is formed such that a root mean square height Rq of a surface of the second conductor circuit is 1.0 µm or less.

18. The printed wiring board according to claim 1, wherein the second conductor circuit of the second conductor layer is formed such that a ten-point average roughness Rz of a surface of the second conductor circuit is 2.0 µm or less.

19. The printed wiring board according to claim 1, wherein the plurality of resin insulating layer is formed such that a dielectric loss tangent of each of the resin insulating layers is 0.02 or less.

20. The printed wiring board according to claim 1, wherein the second conductor circuit of the second conductor layer is formed such that a root mean square height Rq of a surface of the second conductor circuit is 1.0 µm or less and that a ten-point average roughness Rz of the surface of the second conductor circuit is 2.0 µm or less, and the plurality of resin insulating layer is formed such that a dielectric loss tangent of each of the resin insulating layers is 0.02 or less.

* * * * *